United States Patent
Farber et al.

(10) Patent No.: US 6,780,756 B1
(45) Date of Patent: Aug. 24, 2004

(54) ETCH BACK OF INTERCONNECT DIELECTRICS

(75) Inventors: David G. Farber, Wylie, TX (US); Ting Tsui, Plano, TX (US); Robert Kraft, Plano, TX (US); Craig Huffman, Krugerville, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/375,996

(22) Filed: Feb. 28, 2003

(51) Int. Cl.[7] .............. H01L 21/4763; H01L 21/302; H01L 21/461; H01L 21/31; H01L 21/469
(52) U.S. Cl. .............. 438/622; 438/631; 438/690; 438/761
(58) Field of Search .............. 438/622, 631, 438/690, 761, 634

(56) References Cited

U.S. PATENT DOCUMENTS

| | | | |
|---|---|---|---|
| 6,258,709 B1 * | 7/2001 | McDaniel | 438/622 |
| 6,331,481 B1 * | 12/2001 | Stamper et al. | 438/626 |
| 6,372,632 B1 * | 4/2002 | Yu et al. | 438/634 |
| 2002/0108929 A1 * | 8/2002 | Ho et al. | 216/58 |
| 2002/0177322 A1 * | 11/2002 | Li et al. | 438/710 |
| 2003/0107069 A1 * | 6/2003 | Takao | 257/296 |
| 2003/0116439 A1 * | 6/2003 | Seo et al. | 205/125 |
| 2003/0211750 A1 * | 11/2003 | Kim et al. | 438/711 |

* cited by examiner

*Primary Examiner*—Chandra Chaudhari
*Assistant Examiner*—Nema Berezny
(74) *Attorney, Agent, or Firm*—Rose Alyssa Keagy; W. James Brady, III; Frederick J. Telecky, Jr.

(57) ABSTRACT

An embodiment of the invention is a metal layer 14 of a back-end module 6 where the height of the interconnects 17 is greater than the height of the dielectric regions 20. Another embodiment of the invention is a method of fabricating a semiconductor wafer 4 where the height of the interconnects 17 is greater than the height of the dielectric regions 20.

42 Claims, 8 Drawing Sheets

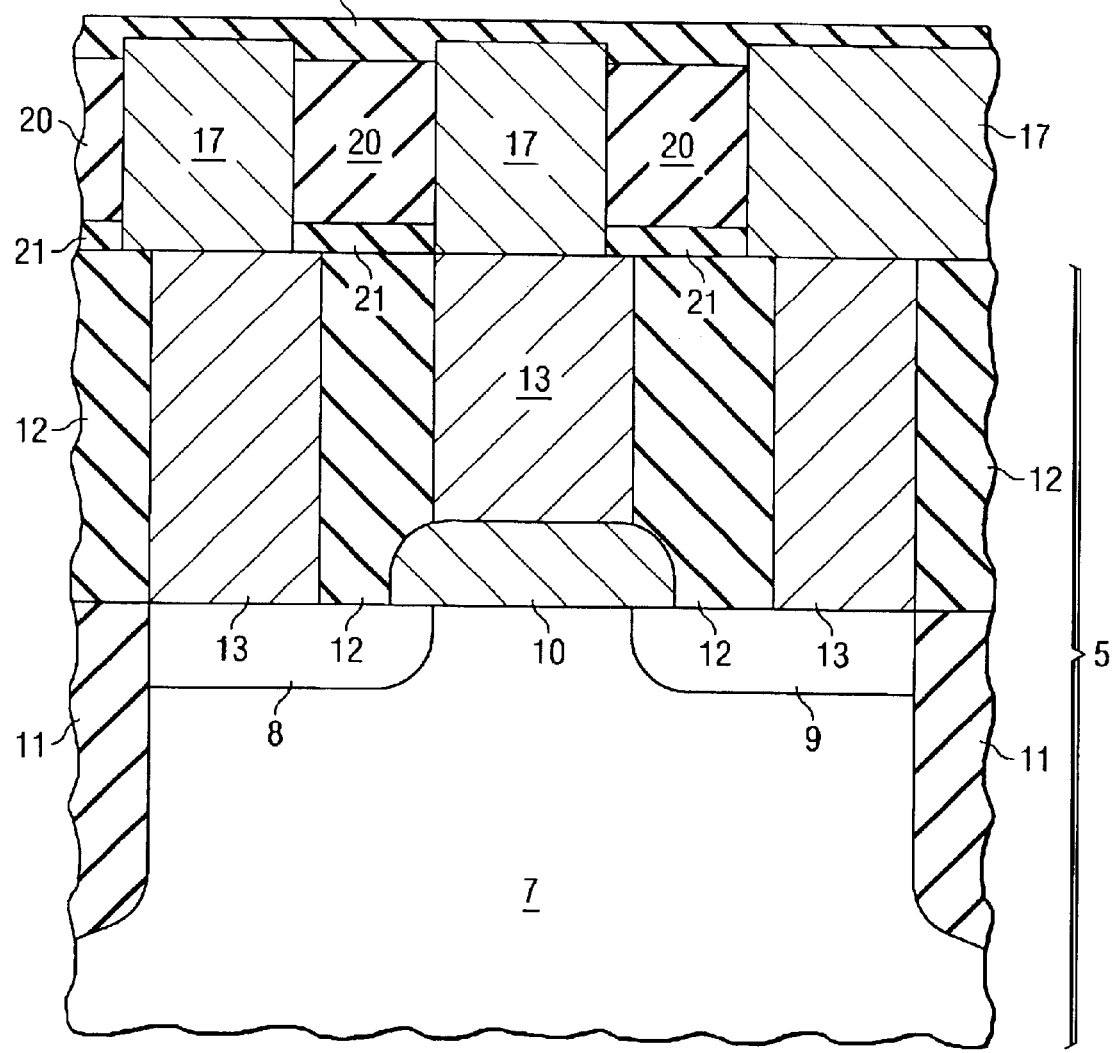

ETCH BACK OF INTERCONNECT DIELECTRICS

BACKGROUND OF THE INVENTION

This invention relates to an etch back of the interconnect dielectric to improve electrical and mechanical reliability.

BRIEF DESCRIPTION OF THE DRAWINGS

FIGS. 4A–4F are cross-sectional views of a partially fabricated semiconductor wafer in accordance with the present invention.

DETAILED DESCRIPTION OF THE INVENTION

Figure 1:
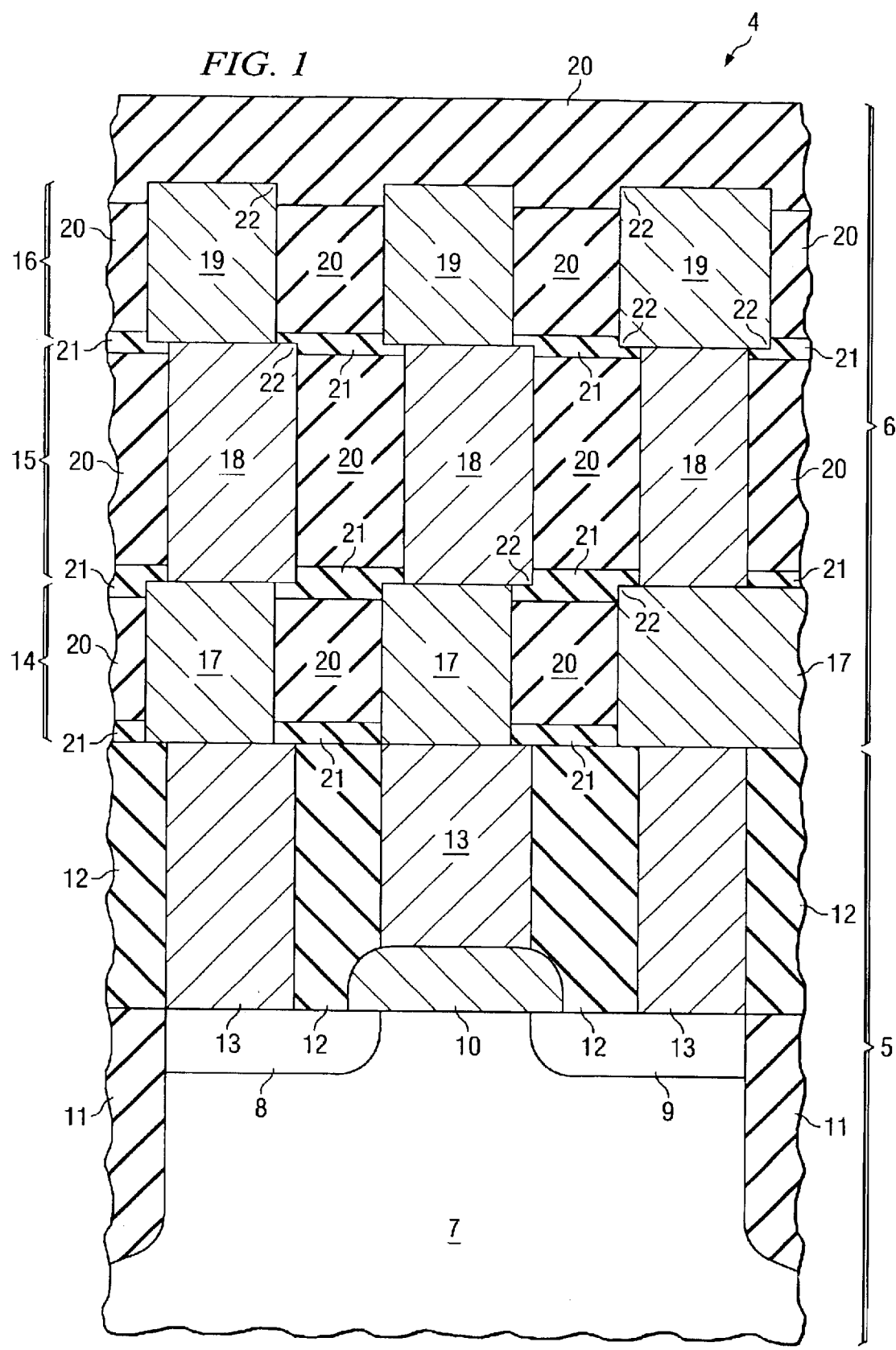
FIG. 1 is a cross-section view of a semiconductor wafer in accordance with the present invention.

The present invention will now be described with reference to the attached drawings wherein like reference numerals are used to refer to like elements throughout. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The figures are not drawn to scale; they are provided merely to illustrate the present invention.

Referring to the drawings, FIG. 1 depicts a best mode application of the present invention. FIG. 1 shows a cross section of a portion of a semiconductor wafer 4. The example semiconductor wafer 4 is divided into two sections: a front-end module 5, and a back-end module 6. It is within the scope of the invention to have any form of logic within the front-end module. The example logic contained in the partial semiconductor wafer 4 is a transistor formed in the substrate 7 that has source/drain 8, 9 and gate 10. Any one of a number of isolation structures 11 is used adjacent to the transistor to electrically separate the transistors from each other. Immediately above the transistor is a layer of insulation 12 containing metal contacts 13 which electrically tie the transistor to the other logic elements (not shown) of the front-end structure 5. As an example, insulation 12 may be $SiO_2$ and metal contacts 13 may comprise W.

The back-end module 6 contains one or more metal or via layers 14, 15, 16. Each metal or via layer contains interconnects. The interconnects may be metal lines 17, 19 that route electrical signals and power properly through the electronic device. In addition, the interconnects may be vias 18 that properly connect the metal lines 17 of a first metal layer 14 to the metal lines 19 of a second metal layer 16. As an example, the interconnects 17, 18, 19 may be comprised of a metal such as copper.

The interconnects are electrically insulated by any one of a number of dielectric materials 20. In the example application, the dielectric insulation 20 is a low-k material such as Organo-Silicate Glass ("OSG").

In addition, there is a thin dielectric layer 21 formed between the dielectric regions 20. It is within the scope of this invention to use any suitable material for the dielectric layer 21. For example, the dielectric layer 21 may comprise SiC. The use of a dielectric layer 21 is optional; however, the dielectric layer 21 may perform many functions. For example, dielectric layer 21 may function as a barrier layer; preventing the diffusion of copper from interconnects 17 to either the silicon channel of the transistor or another isolated metal line (thereby creating an electrical short). Second, dielectric layer 21 may function as an etch stop when forming the features within the dielectric insulation 20 during manufacturing to eventually create the interconnects 17, 18, 19. Lastly, the dielectric layer 21 may function as an adhesion layer to help hold a layer of OSG 20 to a metal interconnect 17, 18. 19. For purposes of readability, the dielectric layer 21 will be called the barrier layer 21 during the rest of the description of this invention.

As shown in FIG. 1, the edges of the metal lines 17. 19 and vias 18 are often not fully landed or aligned correctly. Therefore, there are numerous sharp corners 22 at the top or bottom surfaces of the interconnects 17, 18, 19. These corners 22 are high electrical field stress points. When corners 22 are adjacent to the interface between the dielectric 20 and the barrier 21, the electrical breakdown strength of the interconnects 17, 18, 19 is reduced. Therefore, in the best mode application, the corners 22 are offset from any dielectric-barrier interface 20, 21. Thus the reliability of the electrical circuit is improved because the proximity of the dielectric-barrier interface 20, 21 is offset from the high field stress region of the interconnects 17, 18, 19.

Figure 2:
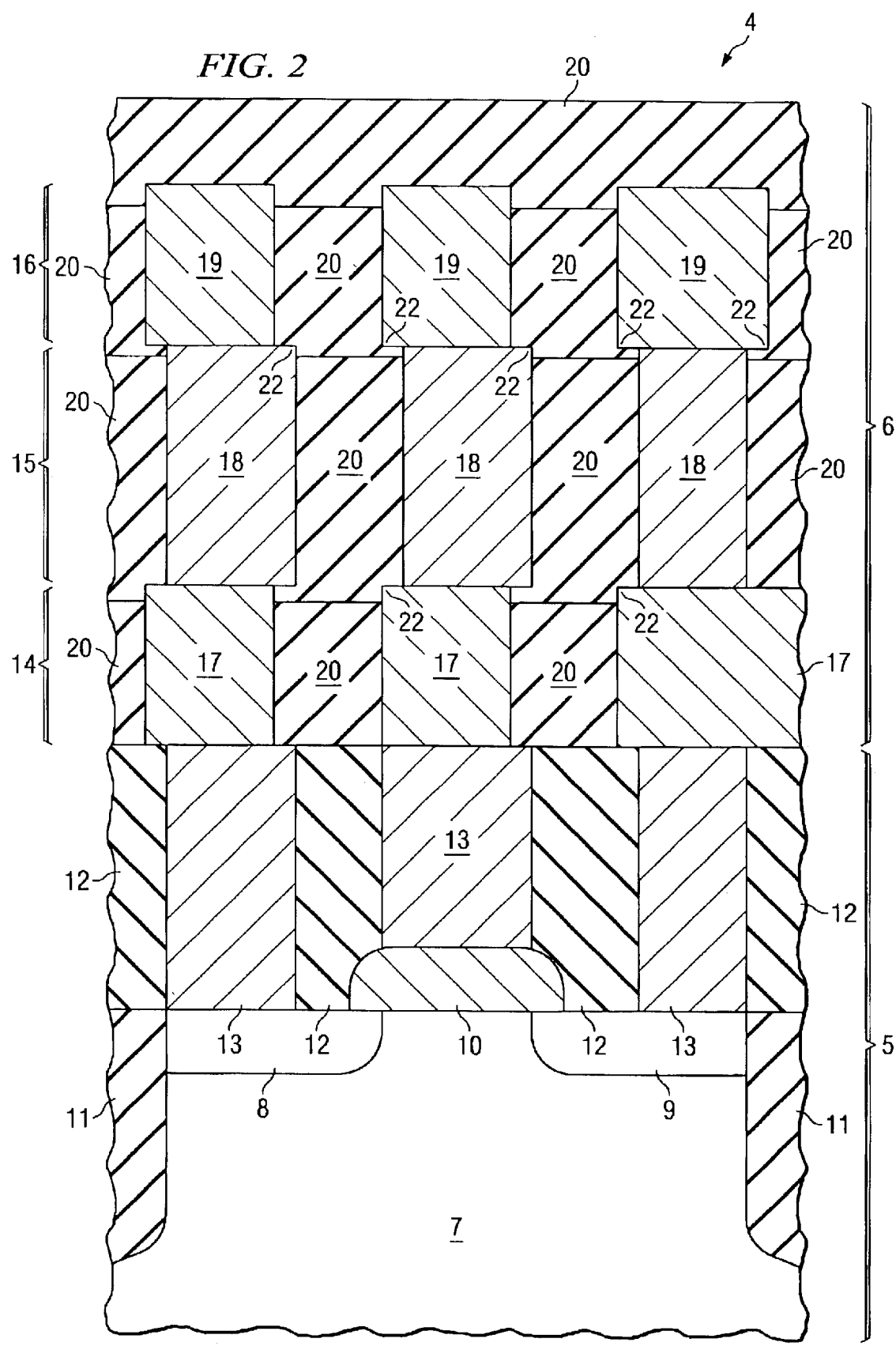
FIG. 2 is a cross-section view of a semiconductor wafer in accordance with another embodiment of the present invention.

Referring again to the drawings, FIG. 2 shows another implementation of the present invention. FIG. 2 shows a cross section of a portion of a semiconductor wafer 4 that is similar to the semiconductor wafer 4 of FIG. 1. (Similar reference numerals are used throughout the figures to designate like or equivalent features.) However, the semiconductor wafer 4 in FIG. 2 does not contain the barrier layer 21. Therefore, in accordance with the invention, the corners 22 of interconnects 17, 18, 19 are located within the bulk of the dielectric portion 20 of the adjacent metal or via layer (i.e. via layer 5 and metal layer 16).

Figure 3:
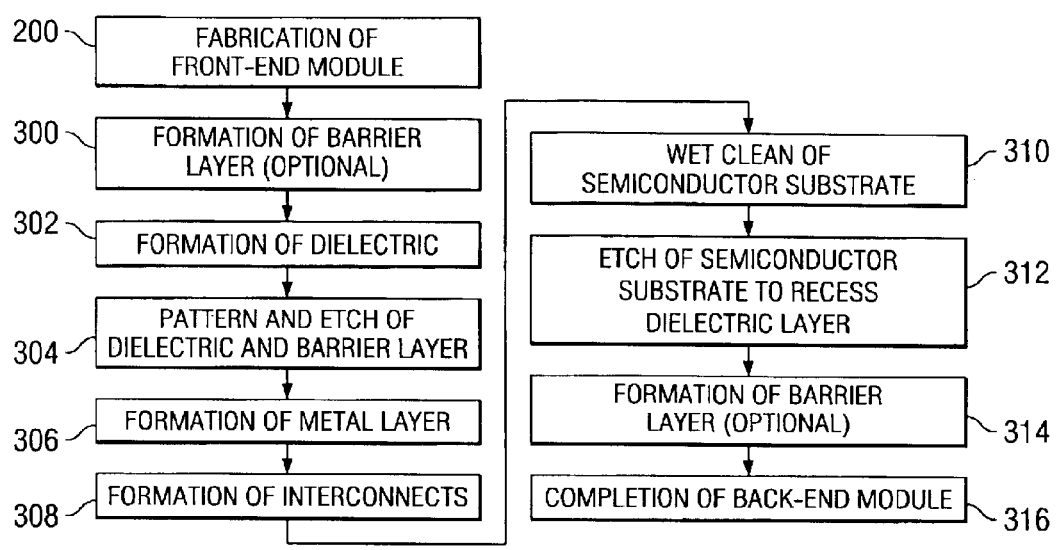
FIG. 3 is a flow diagram illustrating the process flow of the present invention.

Referring again to the drawings, FIG. 3 is a flow diagram illustrating the process flow of the best mode embodiment of the present invention. Other than process step 312 and possibly process step 310, the front-end and back-end process steps should be those standard in the industry. The present invention may be used in any integrated circuit configuration; therefore (step 200) the front-end module 5 may be fabricated to perform any device function.

Next the first metal layer 14 is fabricated over the frontend module 5. Referring now to FIGS. 3 and 4A–D, a barrier layer 21 may be formed (step 300) over the entire substrate. (It is within the scope of this invention to omit the barrier layer 21 from the back end module.) Next a dielectric layer 20 is formed (step 302, FIG. 4A) over the entire substrate (i.e. over the barrier layer 21, if present). The barrier layer 21 and the dielectric layer 20 my be formed using any manufacturing process such as Chemical Vapor Deposition ("CVD"). In this example application, the barrier layer 21 is comprised of SiC and the dielectric layer 20 is comprised of OSG; however, any dielectric material may be used. The barrier layer 21 (if present) and the dielectric layer 20 are then patterned and etched (step 304, FIG. 4B) to form holes for the metal interconnects.

A metal layer 17 is now formed (step 306, FIG. 4C) over the substrate. In the best mode application, the metal layer is copper; however, the use of other metals such as aluminum or titanium are within the scope of this invention. The metal layer 17 is now polished (step 308, FIG. 4D) until the top surface of the dielectric 20 is exposed and the metal interconnects 17 are formed. In the best mode application, step 308 is performed using a Chemical Mechanical Polish ("CMP"); however, other manufacturing techniques may be used.

A wet clean (step 310) may now be performed and may use deionized water or acid. However, it's likely that harmful post-CMP residue will remain on the surface of the semiconductor wafer even after the wet clean process. This residue may consist of leftover slurry (i.e. tungsten or silicon oxide balls), carbon particles (which are attracted to the porous low-k dielectric material 20), or slurry packed into surface recesses created by the CMP process. This harmful post-CMP residue weakens the adhesion of subsequent material layers and also reduces the electrical breakdowvn strength of the back-end module.

Figure 4A:
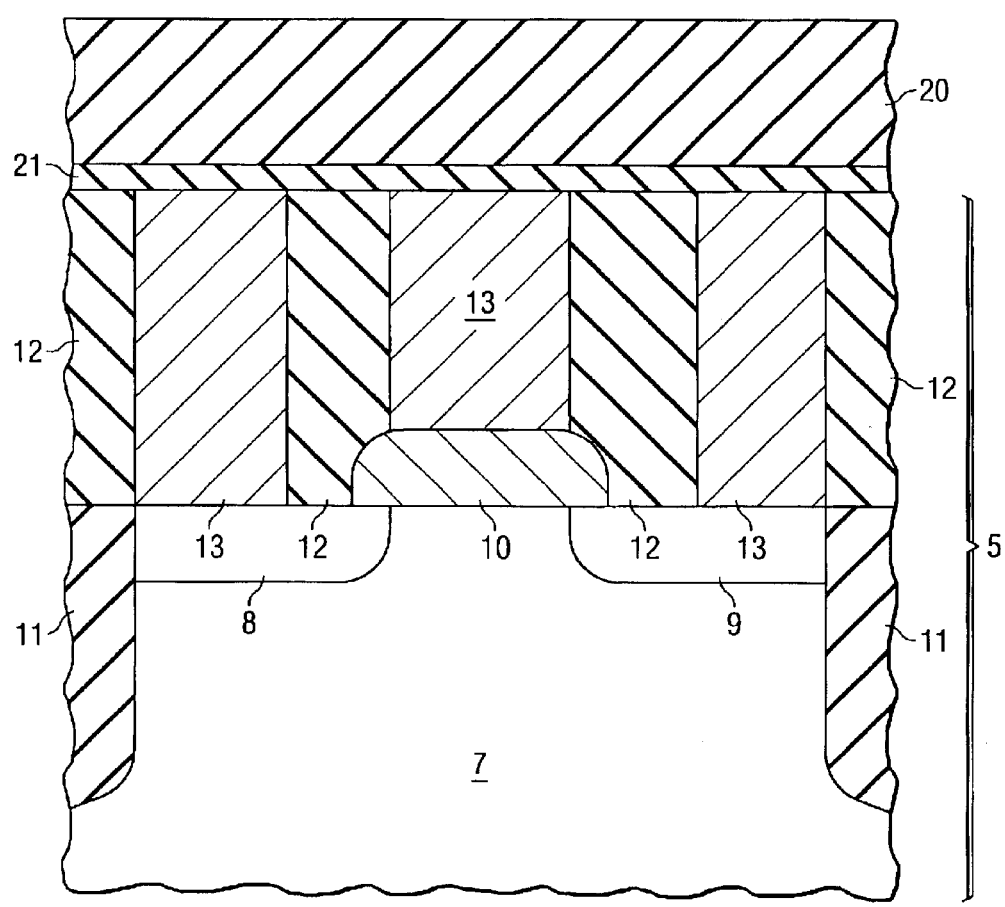
Figure 4B:
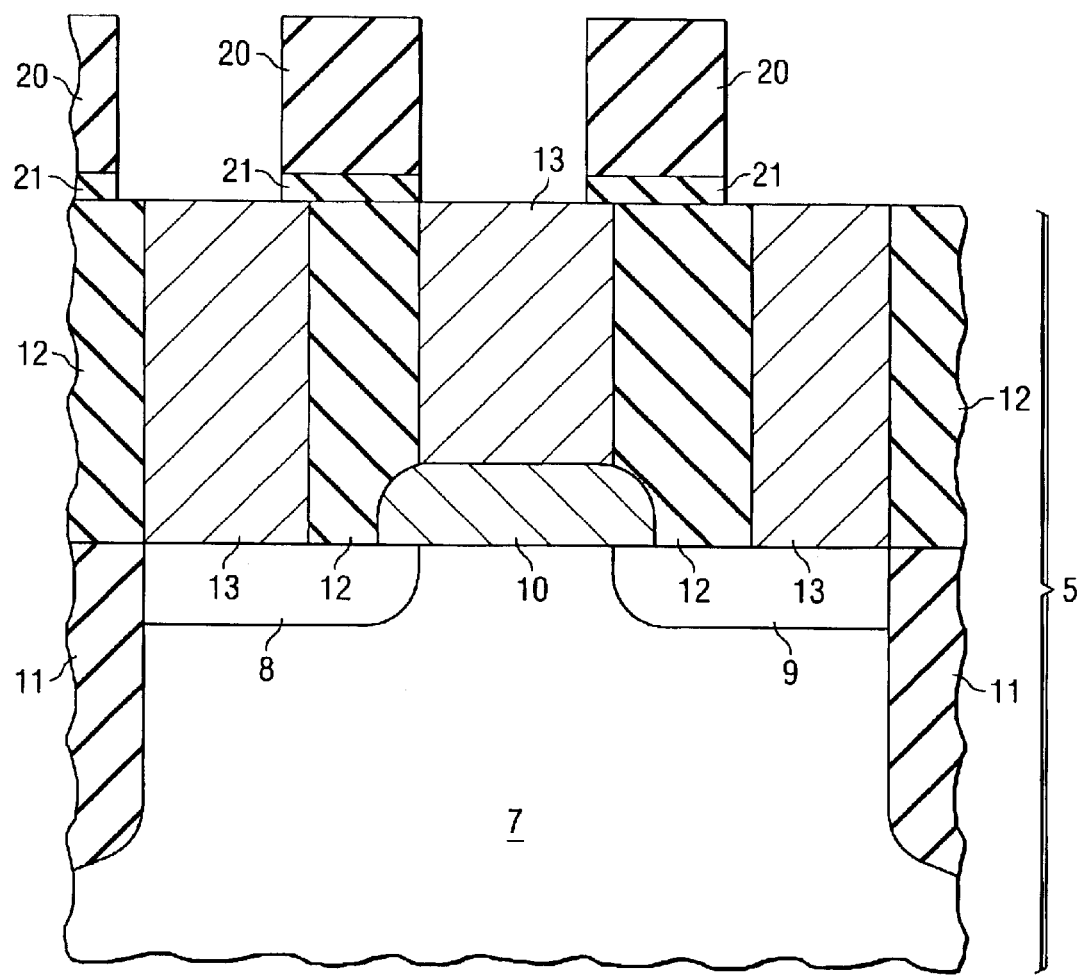
Figure 4C:
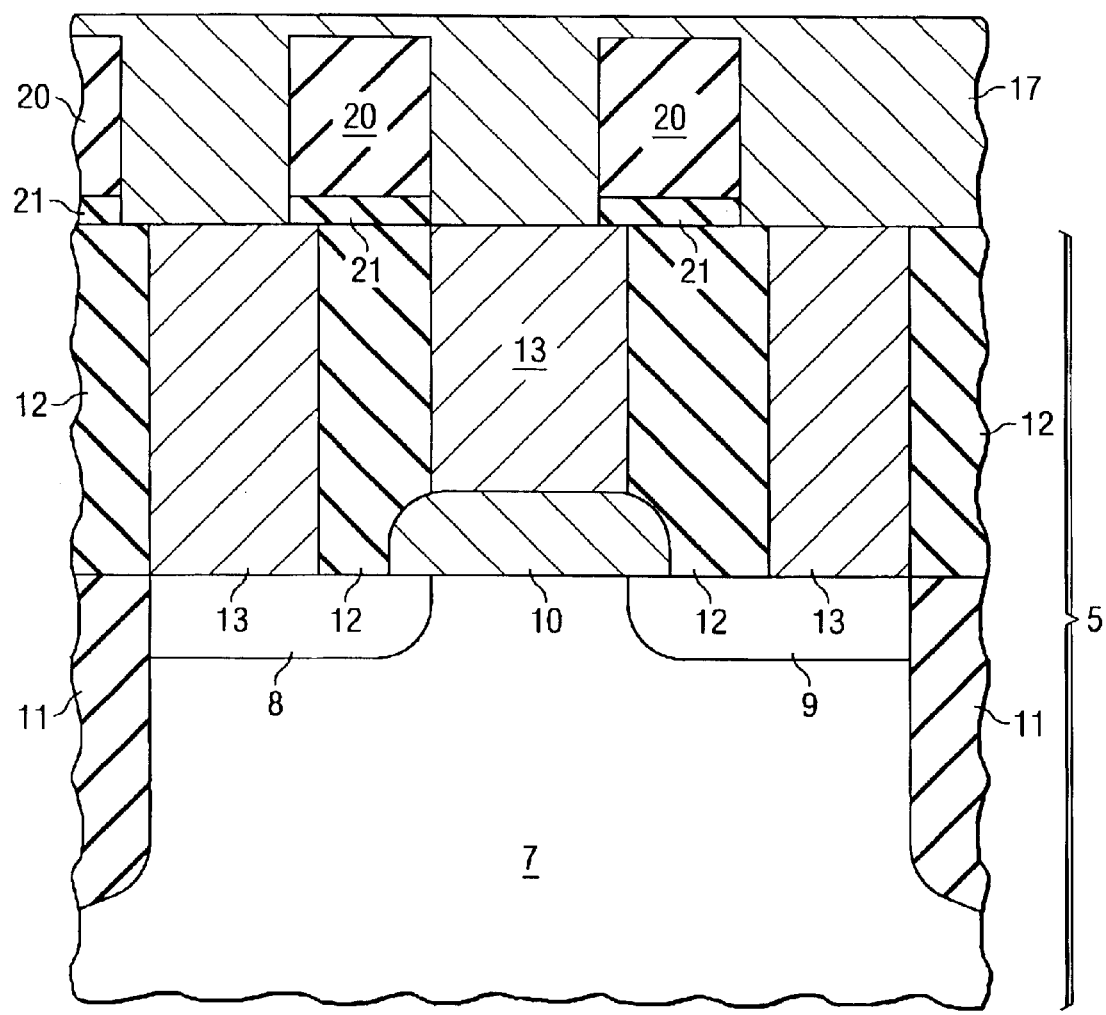
Figure 4D:
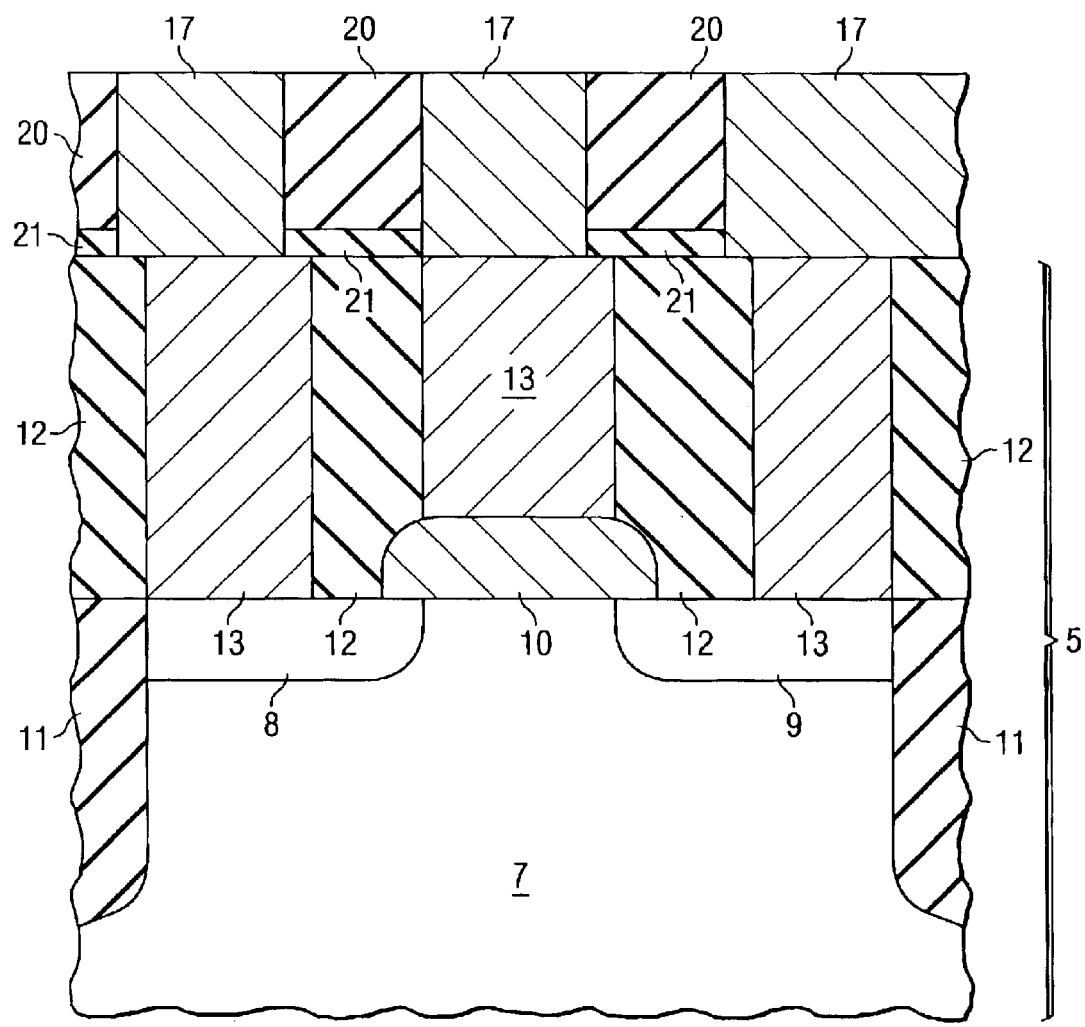
Figure 4E:
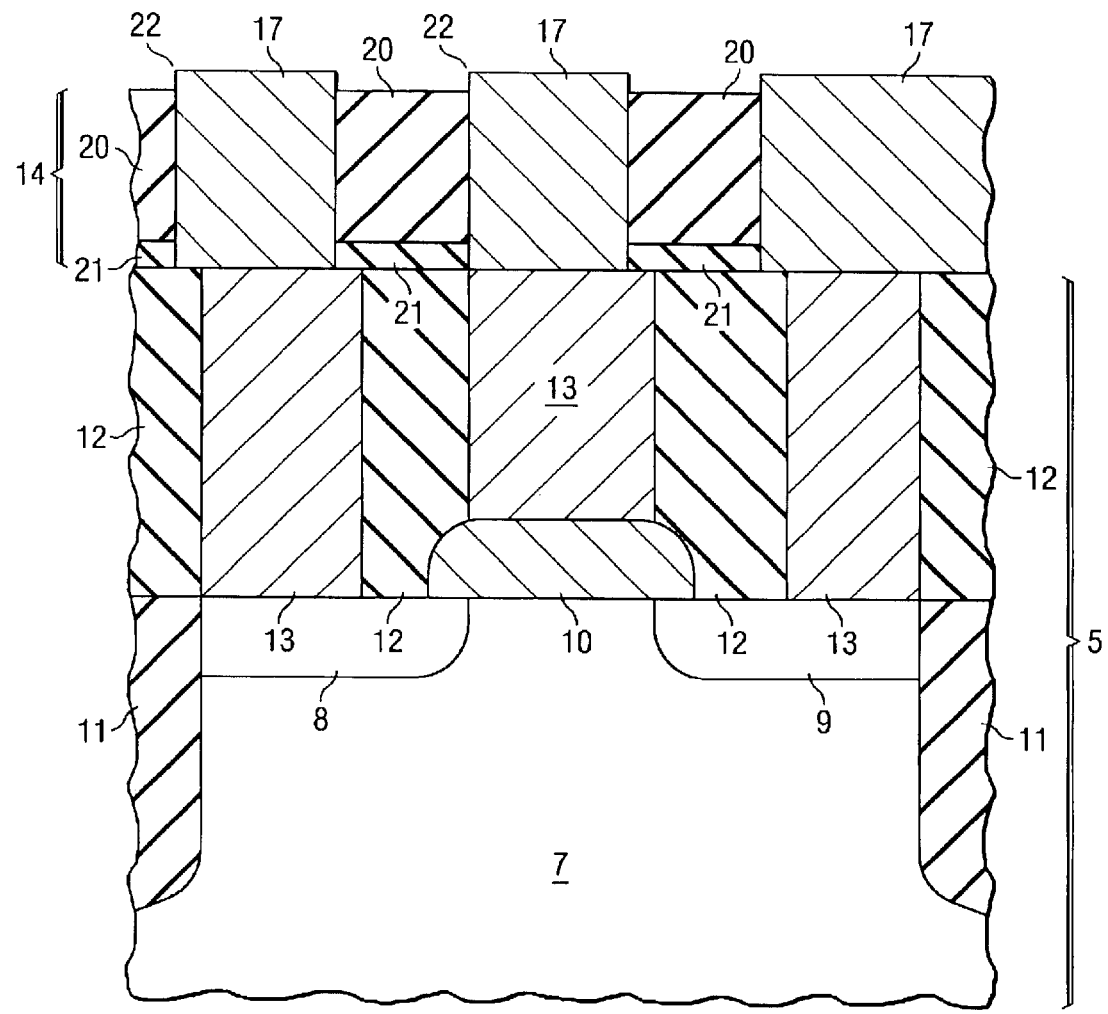

In accordance with the best mode application, the dielectric 20 between the copper interconnects 17 is etched (step 312, FIG. 4E) so that the top surface of the dielectric 20 is lower than the top surface of the copper interconnects 17. As an example, the top surface of the dielectric 20 may be 10–30% below the top surface of the interconnects 17. This etch step removes the harmful post-CMP residue and also lowers the interface of dielectric 20 from the high electric field corners 22 of the interconnects 17.

The etch step 312 may be a plasma etch that is similar to the standard plasma etch used to etch barrier dielectric material. However, the use of any dielectric etch is within the scope of this invention. The etch is selective to the film the etch lands on. For example, the etch of step 312 may be a silicon carbide etch or a silicon nitride etch. Moreover, step 312 may be performed using the wet clean process of step 310 to recess the dielectric regions 20 plus a solvent that removes the remaining post-CMP residue. The first metal layer 14 is now complete.

An optional barrier layer 21 may now be formed (step 314, FIG. 4F) over the semiconductor substrate. The barrier layer 21 may comprise any dielectric material, such as SiC. Now the fabrication any remaining metal layers 15, 16 of the back-end module continues (step 316) until the back-end module is complete. Referring back to FIG. 1, the completed back-end module may contain one or more metal layers 14, 15, 16 to be used as vias or signal and power lines. Moreover, the present invention may be used in any location throughout the back-end module.

If a barrier layer 21 is used, then the interface between the dielectric 20 and the barrier 21 will be below the highest electric field stress point corner 22 (as shown in FIG. 1). If a barrier layer 21 is not used, then the interface between the dielectric material 20 of adjoining metal layers 14, 15, 16 is also recessed from the corners 22 of the interconnects 17, 18, 19 (as shown in FIG. 2).

Various modifications to the invention as described above are within the scope of the claimed invention. As an example, instead of OSG, the dielectric material 20 may be aerogel, BLACK DIAMOND, xerogel, SiLK, or HSQ. Similarly, instead of SiC, the barrier material 21 may be silicon nitride, silicon oxide, nitrogen-doped silicon carbide, or oxygen doped silicon carbide. The metal interconnects 17, 18, 19 may be comprised of any suitable metal, such as Cu, W, or Al. In addition, it is within the scope of the invention to have a back-end module structure 6 with a different amount or configuration of metal layers 14, 15, 16 than is shown in FIGS. 1 and 2. Furthermore,the invention is applicable to semiconductor wafers having different front-end well and substrate technologies, transistor configurations, and metal connector materials or configurations. Moreover, the invention is applicable to other semiconductor technologies such as BiCMOS, bipolar, SOI, strained silicon, pyroelectric sensors, opto-electronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing a semiconductor wafer comprising:
   forming a front-end structure over a semiconductor substrate;
   forming a first layer of a back-end structure over said front-end structure, said first layer of a back-end structure having interconnects and regions of low-k material; and
   etching a top surface of said first layer of a back-end structure, wherein a height of said regions of low-k material is less than a height of said interconnects.

2. The method of claim 1 wherein said etching step comprises dry etch.

3. The method of claim 2 wherein said etching step comprises plasma etch.

4. The method of claim 3 wherein said plasma etch is a silicon carbide etch.

5. The method of claim 1 wherein said etching step comprises wet etch.

6. The method of claim 5 wherein said wet etch includes the use of a solvent.

7. The method of claim 5 wherein said wet etch is deionized water.

8. The method of claim 1 wherein said low-k material provides insulation for said interconnects.

9. The method of claim 1 wherein said interconnects are metal lines that carry electrical signals and power.

10. The method of claim 1 wherein said interconnects are vias that connect metal lines.

11. The method of claim 1 wherein said regions of low-k material comprise OSG.

12. The method of claim 1 wherein said interconnects comprise copper.

13. The method of claim 1 wherein said height of said regions of low-k material is 10–30% less than said height of said interconnects.

14. The method of claim 1 further comprising the step of forming a barrier layer over said first layer of a back-end structure.

15. The method of claim 14 wherein said barrier layer comprises SiC.

16. The method of claim 14 further comprising the step of forming a second layer of a back-end structure over said barrier layer, said second layer of a back-end structure having second layer interconnects and second layer regions of low-k material.

17. The method of claim 16 further comprising the step of etching a top surface of said second layer of a back-end structure, wherein a height of said second layer regions of low-k material is less than a height of said second layer interconnects.

18. The method of claim 17 wherein said height of said second layer regions of low-k material is 10–30% less than said height of said second layer interconnects.

19. The method of claim 1 further comprising the step of forming a second layer of a back-end structure over said first layer of a back-end structure, said second layer of a back-end structure having second layer interconnects and second layer regions of low-k material.

20. The method of claim 19 further comprising the step of etching a top surface of said second layer of a back-end structure, wherein a height of said second layer regions of low-k material is less than a height of said second layer interconnects.

21. The method of claim 20 wherein said height of said second layer regions of low-k material is 10–30% less than said height of said second layer interconnects.

22. The method of claim 20 wherein said etching step comprises plasma etch.

23. A method of manufacturing a semiconductor wafer comprising:

forming a front-end structure over a semiconductor substrate;

forming a first layer of low-k material over said front-end structure, forming holes through said first layer of low-k material;

forming a metal layer over said first layer of low-k material, said metal layer also filling said holes;

reducing a height of said metal layer to form first layer metal interconnects and expose a top surface of said first layer of low-k material; and etching a top surface of said semiconductor wafer to make a height of said first layer of low-k material less than a height of said first layer metal interconnects.

24. The method of claim 23 wherein said reducing step comprises a Chemical Mechanical Polish.

25. The method of claim 23 wherein said etching step comprises plasma etch.

26. The method of claim 25 wherein said plasma etch is a silicon carbide etch.

27. The method of claim 23 wherein said first layer of low-k material provides insulation for said first layer metal interconnects.

28. The method of claim 23 wherein said first layer metal interconnects are metal lines that carry electrical signals and power.

29. The method of claim 23 wherein said first layer metal interconnects are vias that connect metal lines.

30. The method of claim 23 wherein said first layer of low-k material comprises OSG.

31. The method of claim 23 wherein said first layer metal interconnects comprise copper.

32. The method of claim 23 wherein said holes are formed using a dielectric etch process.

33. The method of claim 23 wherein said height of said first layer of low-k material is 10–30% less than said height of said first layer metal interconnects.

34. The method of claim 23 further comprising the step of forming a barrier layer over first layer of low-k material and first layer metal interconnects.

35. The method of claim 34 wherein said barrier layer comprises SiC.

36. The method of claim 34 further comprising the steps of:

forming a second layer of low-k material over said barrier layer, forming holes through said second layer of low-k material;

forming a metal layer over said second layer of low-k material, said metal layer also filling said holes;

reducing a height of said metal layer to form second layer metal interconnects and expose a top surface of said second layer of low-k material; and etching a top surface of said semiconductor wafer to make a height of said second layer of low-k material less than a height of said second layer metal interconnects.

37. The method of claim 36 wherein said height of said second layer of low-k material is 10–30% less than said height of said second layer metal interconnects.

38. The method of claim 34 wherein said barrier layer is also an etch stop layer.

39. The method of claim 34 wherein said barrier layer is also an adhesion layer.

40. The method of claim 34 wherein said barrier layer is prevents diffusion of said first layer metal interconnects.

41. The method of claim 23 further comprising the steps of:

forming a second layer of low-k material over said first layer of low-k material, forming holes through said second layer of low-k material;

forming a metal layer over said second layer of low-k material, said metal layer also filling said holes;

reducing a height of said metal layer to form second layer metal interconnects and expose a top surface of said second layer of low-k material; and etching a top surface of said semiconductor wafer to make a height of said second layer of low-k material less than a height of said second layer metal interconnects.

42. The method of claim 38 wherein said height of said second layer of low-k material is 10–30% less than said height of said second layer metal interconnects.

* * * * *